United States Patent [19]

Levinson et al.

[11] Patent Number: 4,615,765
[45] Date of Patent: Oct. 7, 1986

[54] SELF-REGISTERED, THERMAL PROCESSING TECHNIQUE USING A PULSED HEAT SOURCE

[75] Inventors: Lionel M. Levinson, Schenectady; Christopher P. Yakymyshyn, Ithaca, both of N.Y.

[73] Assignee: General Electric Company, Schenectady, N.Y.

[21] Appl. No.: 697,376

[22] Filed: Feb. 1, 1985

[51] Int. Cl.$^4$ .................. H01L 21/306; B44C 1/22
[52] U.S. Cl. ........................... 156/643; 156/628; 156/635; 156/656; 156/657; 156/662; 156/664; 219/121 LJ; 219/121 LM; 427/53.1; 427/256
[58] Field of Search .............. 156/643, 654, 655, 656, 156/657, 659.1, 662, 664, 635, 628; 252/79.3; 219/121 LA, 121 LH, 121 LJ, 121 LM; 427/53.1, 256, 282, 314

[56] References Cited

U.S. PATENT DOCUMENTS

| | | | |
|---|---|---|---|
| 3,364,087 | 1/1968 | Solomon et al. .................. | 156/4 |
| 4,151,008 | 4/1979 | Kirkpatrick ...................... | 148/1.5 |
| 4,229,232 | 10/1980 | Kirkpatrick ...................... | 148/1.5 |
| 4,261,764 | 4/1981 | Narayan ........................... | 148/1.5 |
| 4,388,517 | 6/1983 | Shulte et al. ................... | 219/121 LJ |
| 4,395,433 | 7/1983 | Nagakubo et al. ................ | 427/35 |
| 4,396,456 | 8/1983 | Cook ................................ | 156/602 |
| 4,415,383 | 11/1983 | Naem et al. ..................... | 148/187 |
| 4,448,636 | 5/1984 | Baber .............................. | 156/643 |
| 4,490,210 | 12/1984 | Chen et al. ..................... | 156/643 |
| 4,490,211 | 12/1984 | Chen et al. ..................... | 156/643 |
| 4,518,456 | 5/1985 | Bjorkholm ....................... | 156/626 |

Primary Examiner—William A. Powell
Attorney, Agent, or Firm—John R. Rafter; James C. Davis, Jr.; Marvin Snyder

[57] ABSTRACT

Thermal processing of selected areas of a workpiece, such as a semiconductor device, is implemented without a photolithographic masking step. This is achieved through the use of a pulse-mode source of heat energy, such as a laser or a particle beam source, the heat radiation of which is applied in blanket fashion to a workpiece. Selective heating of workpiece areas to be thermally processed is attained through appropriate selection of energy, pulse duration, and pulse interval operating parameters of the heat source. Specifically, the appropriate selection of heat energy defines which areas of a workpiece are to be selectively heated, while the appropriate selection of heat energy pulse duration and heat energy pulse interval minimizes stray heat transfer to non-selected areas of the workpiece.

24 Claims, 9 Drawing Figures

SELF-REGISTERED, THERMAL PROCESSING TECHNIQUE USING A PULSED HEAT SOURCE

BACKGROUND OF THE INVENTION

The present invention relates to a method of thermally processing selected areas of an exposed surface of a workpiece through the use of a pulsed heat energy source, and, more particularly, to such thermal processing method wherein the heat source comprises a blanket source of heat.

Workpieces on which selective deposition of material or selective etching is desired include, by way of example, semiconductor electrical devices and printed-wiring boards that are undergoing fabrication. For example, the fabrication of semiconductor devices typically involves the deposition of material, such as metallization or a dielectric, on selected areas of a semiconductor device, and also typically involves etching of material, such as semiconductor material, metal, or dielectric, from the semiconductor device at selected locations. The localization of material to be deposited onto a semiconductor device, or of an etchant for removing material at selected locations, may be performed through the use of a standard photolithographic mask that conceals areas of a semiconductor device on which deposition or etching is to be avoided. Unless such photolithographic mask is the first mask used in device processing, it usually must be carefully aligned with previously-defined features of the device in an alignment process known as registration of the mask to such previous features. To assure a high device manufacturing yield, allowance for tolerances in registration alignment must be made. This requirement, unfortunately, restricts the minimum feature size of the device. Moreover, the added fabrication complexity entailed by use of a photolithographic mask adds to device cost.

Workpieces other than semiconductor devices also suffer from the drawbacks of photolithographic masking to define localized areas for deposition of material or etching. For example, alumina or silicon circuit boards and plastic printed-wiring boards fall into this category. It would thus be desirable to provide a technique for depositing material or etching in selected locations of a workpiece, such as a semiconductor device, wherein the desired features are automatically registered to previous structures. This would avoid the need for alignment tolerances that restrict minimum feature size, while assuring high manufacturing yields.

SUMMARY OF THE INVENTION

Accordingly, it is an object of the invention to provide a self-registered technique for processing selected areas of a workpiece at which features are to be defined.

A further object of the invention is to provide a self-registered processing technique having a selectivity that can be independent of the surface chemistry of a workpiece.

Yet another object of the invention is to provide a self-registered processing technique that can achieve sub-micron resolution of features on a workpiece.

The foregoing and further objects of the invention are realized, in preferred form, in a method of thermally processing selected areas of an exposed surface of a workpiece. The workpiece is generally plate-shaped and has an exposed surface comprising active areas of a first region to be heated for thermal processing thereof, and passive areas of a second region to be maintained at a lesser temperature than the active areas to minimize thermal processing thereof. A pulse-mode source of blanket heat energy is provided, with predetermined energy, pulse duration, and pulse interval operating parameters. The energy parameter of the heat energy source is selected to achieve heat absorption in the first region, so as to raise the temperature of the active areas, while minimizing heat absorption in the second region, so as to limit any temperature rise of the passive areas. The pulse duration of the heat energy source is selected to be sufficiently short while the pulse interval is selected to be sufficiently long so as to minimize stray heat transfer to the passive areas from either the active areas or any incidentally-heated regions of the workpiece, and thereby to limit any temperature rise of the passive areas. Heat radiation from the source of heat energy is directed in blanket fashion to the first and second regions of the workpiece, and thereupon the aforementioned exposed surface of the workpiece is contacted with a heat-activated reactant. In this manner, thermal processing with the heat-activated reactant occurs selectively at the active areas of the exposed surface.

The workpiece may comprise, by way of example, a semiconductor electrical device, an alumina or silicon circuit board, or a printed-wiring board.

BRIEF DESCRIPTION OF THE DRAWINGS

While the specification concludes with claims defining the features of the invention that are regarded as novel, it is believed that the invention, together with further objects thereof, would be better understood from the following description in conjunction with the drawing figures, in which:

FIG. 4 depicts thermal etching of selected areas of the workpiece of FIG. 1, while

FIG. 7 depicts thermal etching of the workpiece of FIG. 6, while

DESCRIPTION OF THE PREFERRED EMBODIMENTS

Figure 1:
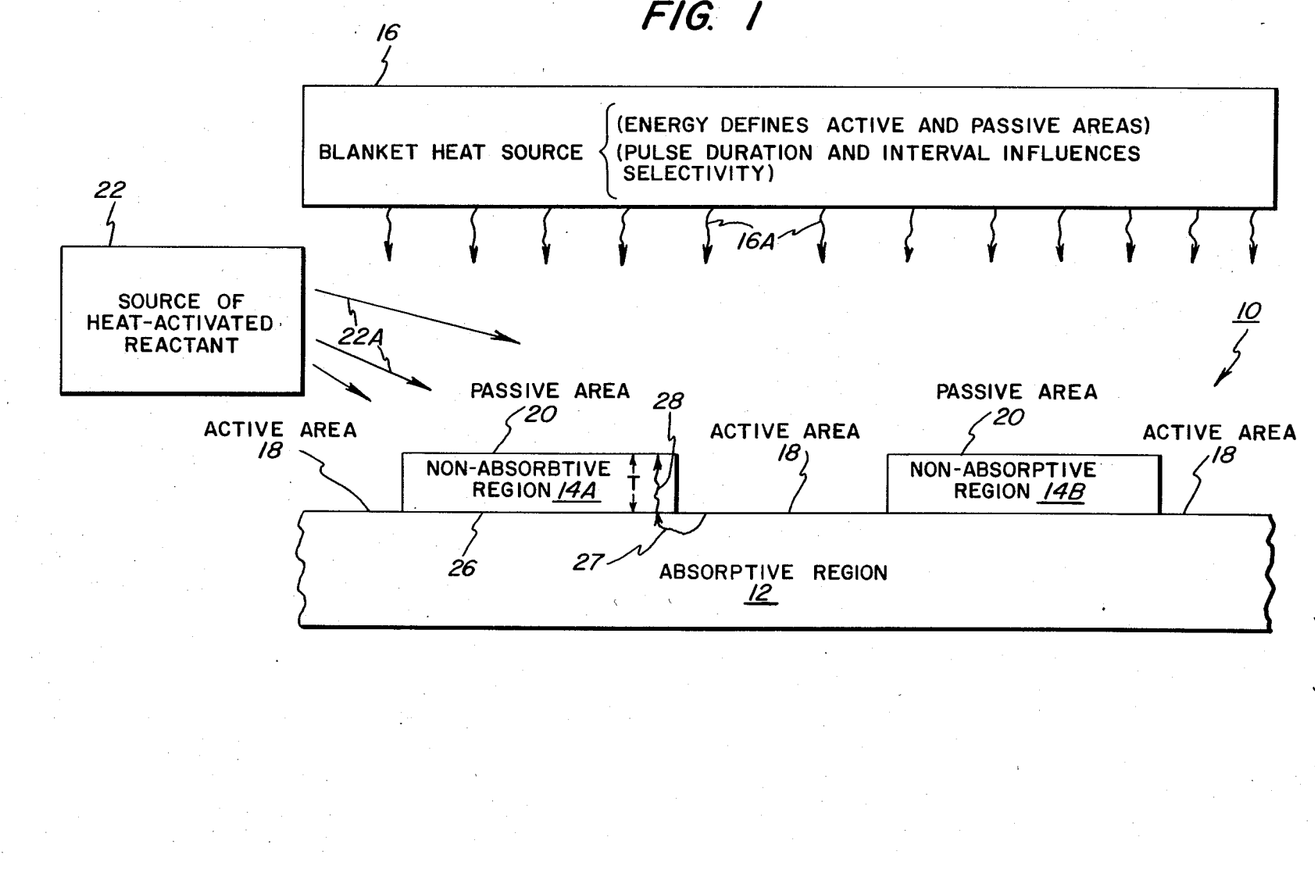
FIG. 1 is a schematic view, partially in block diagram form, of a thermal processing system in accordance with the invention.

FIG. 1 illustrates a workpiece 10 that may be thermally processed in accordance wtih the invention. Workpiece 10 includes a substrate region 12 of a first material, such as silicon, and overlying regions 14A and 14B of a second material, such as respective layers of silicon dioxide. A blanket heat source 16, typically operated in a continuous pulsing mode, is used to impart heat energy 16A, in blanket fashion, onto the entire, upper exposed surface of workpiece 10. Heat source 16 may comprise a laser, or a particle beam source, such as an electron beam source, by way of example. Heat source 16 may be stationary relative to workpiece 10 if heat beam 16A is sufficiently large as to heat the entire exposed surface 18,20; if heat beam 16A is smaller, scanning of exposed surface 18,20 by heat beam 16A is suitably conducted.

Active areas 18 are those portions of exposed surface 18,20 of workpiece 10 that are desired to be thermally processed, while passive areas 20 are those portions of exposed surface 18,20 where thermal processing is desired to be minimized or avoided. A source 22 of heat-activated reactant is included in the thermal processing system of FIG. 1 to provide heat-activated reactant 22A that is directed to exposed surface 18,20 of workpiece 10, as discussed below.

Successful practice of the present invention relies upon the appropriate selection of three operating parameters of blanket heat source 16: (1) the energy; (2) energy pulse duration; and (3) energy pulse interval. Selection of the first parameter, energy, determines which portions of exposed area 18,20 of workpiece 10 constitute active areas, and which portions constitute passive areas. Where heat source 16 comprises a laser, the energy parameter is inversely proportional to the wavelength of the laser, and, thus, selection of a laser wavelength determines laser energy. In using a laser, suitable material for substrate 12, such as silicon, is absorptive to heat energy 16A of a predetermined wavelength, or in a predetermined range of wavelengths, while suitable, overlying regions 14A and 14B, such as silicon dioxide, are non-absorptive to such wavelength or wavelengths. Regions 14A and 14B may be non-absorptive either by virtue of being optically transparent at such wavelength, or being optically reflective at such wavelength. Where heat source 16 comprises a laser, a suitable wavelength for the laser is less than 1.1 microns for a silicon absorptive region 12, while being less than 0.9 microns for a gallium arsenide absorptive region 12. Where heat source 16 comprises an electron beam source, for example, the energy absorption as between substrate region 12 and overlying regions 14A and 14B varies according to the relative mass density of those regions. The absorptive region 12, in this case, is required to have higher mass density than the non-absorptive regions 14A and 14B. For example, absorptive region 12 suitably comprises indium antimonide or mercury cadmium telluride, while non-absorptive regions 14A and 14B comprise silicon dioxide.

The selection of energy pulse duration and energy pulse interval of blanket heat source 16 (FIG. 1) minimizes stray heat transfer to passive areas 20 from areas of workpiece 10 that are heated from blanket heat source 16. Such stray heat transfer predominantly arises in workpiece 10 due to heat generated at interface 26 (between absorptive region 12 and nonabsorptive region 14A), which flows in thermal path 28 (schematically-depicted) to passive area 20. Such heat generation at interface 26 is incidental to the heating of active area 18, and occurs in workpiece 10 so long as non-absorptive region 14A is transparent to heat energy 16A, rather than being reflective of such energy. With or without incidental heat generation at interface 26, heat from active region 18 may flow through thermal path 27 (schematically illustrated), and thence to passive area 20 via heat flow path 28.

To prevent passive areas 20 from becoming overly heated due to stray heat flow in thermal path 28, two measures may be taken. First, the energy pulse duration of blanket heat source 16 can be minimized. Thus, heat in thermal path 28 is not allowed to fully diffuse upwardly to passive area 20, due to cessation of generation of heat at interface 26, which heat provides the upward driving force for heat flow in path 28. Second, the thickness of overlying regions 14A and 14B can be increased, so as to lengthen thermal path 28 and impede heat transfer to passive areas 20.

Figure 2:
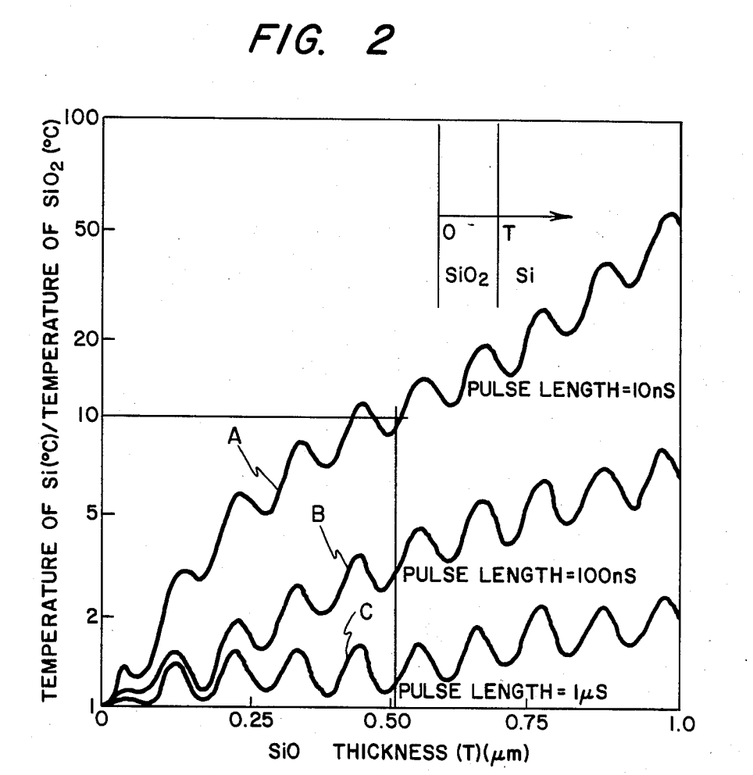
FIG. 2 is a graphical representation of the variance of relative temperatures between active and passive areas of a particular workpiece as a function of heat source pulse duration and thickness of a non-absorptive region, with a legend in the upper, right portion of the Figure.

The effects of varying energy pulse duration, or length, of a laser heat source 16 and thickness, T, of overlying layers 14A and 14B are illustrated in graphical form in FIG. 2.

In particular, FIG. 2 illustrates different curves A, B, and C, depicting the variance in temperature ratio between active and passive areas for a workpiece comprising silicon dioxide ($SiO_2$) on silicon (Si). The curves present approximate data, based on the following assumptions:

Energy wavelength $\lambda = 337$ nm
Energy pulse intensity $= 10^7$ watts/$cm^2$
Energy pulse interval is at least 10 times greater than the specified energy pulse duration (for example, 1000 ns for a 10 ns laser pulse duration)
Reflectance of $SiO_2 = 4$ percent
Absorptance of $SiO_2 = 0$
Reflectance of Si $= 37$ percent
Absorptance depth of Si $= 0$
Thickness of Si exceeds 10 microns Additionally, the graphical data slightly underestimates the temperature of Si, since the data is for $SiO_2$ covering Si. That is, without such overlying $SiO_2$ layer, the Si temperature would be slightly higher, since no heat loss by conduction into the $SiO_2$ layer would occur. Finally, it should be noted that the fluctuations in the illustrated curves A, B, and C are due to optical interference patterns, wherein constructive and destructive energy beam interference patterns arise due to the selection of a discrete wavelength for heat source 16. The interference fluctuations do not alter the basic trend of the curves, however, and, if desired, can be minimized through use of a heat energy source 16 with a broader wavelength band. Selection of a wavelength band must, of course, assure that substrate 12 of workpiece 10 is selectively absorptive to the broad band heat radiation, while overlying layers 14A and 14B are not absorptive, or only minimally absorptive.

Figure 3:
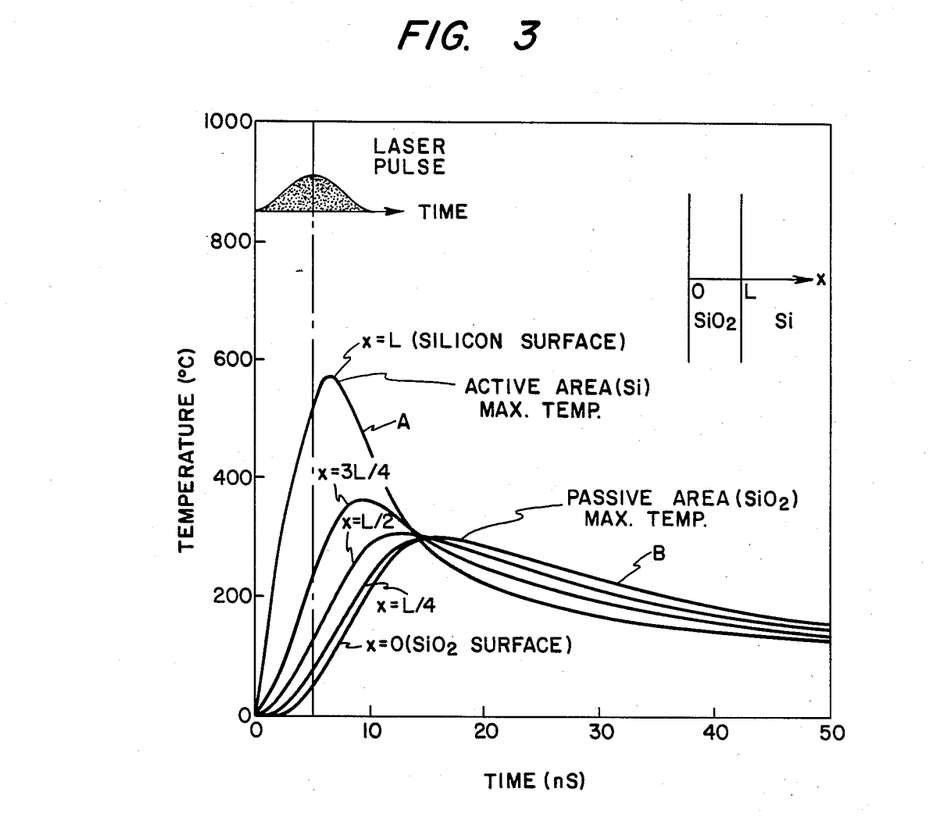
FIG. 3 is a graphical representation comparing the temperatures of active and passive areas of a particular workpiece, with a legend in the upper, right portion of the Figure.

The third operating parameter of blanket heat source 16 referred to above, i.e., energy pulse interval, additionally influences the flow of heat in thermal path 28 of FIG. 1. What is required is that the mean temperature rise of passive areas 20 from pulse-to-pulse be of negligible amount. This is achieved through increasing the pulse interval. The present requirement can be better explained with reference to FIG. 3. In FIG. 3, graphical data is shown for the temperature of active and passive areas for a workpiece comprising $SiO_2$ on Si, and is further based on the following assumptions:

Thickness of $SiO_2$ layer, L $= 1000$ angstroms
Energy pulse intensity $= 10^7$ watts/$cm^2$
Energy wavelength $\lambda$ is in the range: 0.1 $\mu$m $\lambda$ 1.1 $\mu$m
Si thickness is at least 10 times greater than L
Absorptance of $SiO_2 = 0$ Reflectance of $SiO_2 = 0$
Absorption depth of $Si = 0$
Reflectance of $Si = 0$ Additionally, the maximum temperature of the active area as indicated in FIG. 3 is slightly underestimated because it assumes that $SiO_2$ covers Si. The temperature of uncovered Si would be slightly higher, since no heat loss into $SiO_2$ would occur.

In FIG. 3, a heat energy (laser) pulse of about 10 ns duration is shown. Curves A and B indicate the dynamic temperature values of the active area (Si) and of the passive area ($SiO_2$), respectively. Of interest is that the passive area temperature is limited to about 300° C. for the example considered, while the active area temperature reaches about 600° C. A heat-activated reactant that reacts in the temperature range between 300° C. and 600° C., therefore, reacts selectively on the active areas, but not on the passive areas. Of interest in showing an insufficient energy pulse interval is that in FIG. 3 at time=50 nano-seconds, the temperature of the passive area has decreased only to about 200° C. This is an insufficient lowering of temperature, since a second pulse of heat energy at time=50 nanoseconds could raise the passive area temperature to about 500° C.; that is, 300° C. due to the second pulse, and 200° C. due to the first pulse.

A sufficient interval of time between pulses, at a minimum, is 10 times the pulse duration, or 100 nanoseconds in the FIG. 3 example. A sufficient interval between pulses is that interval at which the mean temperature rise is negligible; that is, where the maximum temperature of the passive area does not significantly increase from pulse to pulse. If, on the other hand, the passive area temperature were permitted to rise from pulse to pulse, the selectivity of thermal processing as between active and passive areas could decrease.

Referring again to FIG. 1, once a suitable temperature differential between active areas 18 and passive areas 20 has been achieved through the selection of the energy, pulse duration, and pulse interval parameters of blanket heat source 16, self-registered thermal processing in accordance with the present invention can proceed. Thermal etching or thermal deposition of material may be performed, for example, depending on what type of reactant is contained in source 22 of heat-activated reactant, which, advantageously, may be of gas, liquid, or solid phase. Where a heat-activated etchant is contained in source 22, selective etching of absorptive region 12 may occur as depicted in the detail view of FIG. 4.

Figure 4:
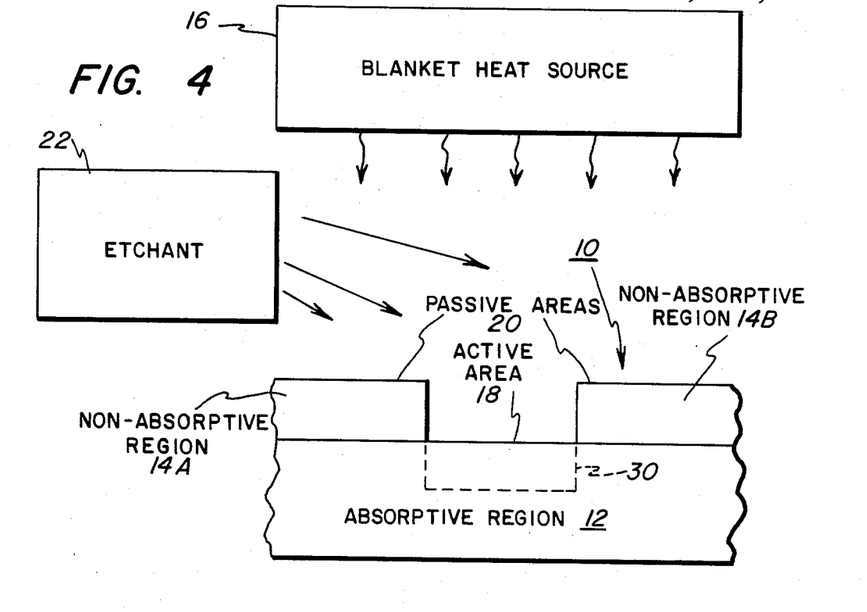

FIG. 4 depicts an etching process in which absorptive region 12 at active area 18 is selectively etched, as at trough 30 (shown in phantom), with little or no etching of non-absorptive regions 14A and 14B. In fact, trough 30 can be formed with sub-micron resolution. Accordingly, the etching process of FIG. 4 is self registering in regard to active area 18.

EXAMPLE I

THERMAL ETCHING

Referring to FIG. 4, where absorptive region 12 comprises silicon (Si) of about 0.03 centimeter thickness for example, and non-absorptive regions 14A and 14B comprise silicon dioxide ($SiO_2$) layers of 0.5 micron thickness, for example, blanket heat source 16 suitably comprises a laser with a wavelength below 1.1 microns, such as a frequency-doubled Nd:YAG (Neodynium:Yttrium-Aluminum-Garnet) laser with an energy wavelength of 530 nanometers to achieve selective heating of the silicon. A suitable heat-activated reactant comprises liquid phase hydrofluoric acid (HF) and nitric acid ($HNO_3$) in a 1:99 volume ratio. the chemical reaction that occurs is governed by the following equations:

$$2HNO_3 + 2Si \rightarrow 2SiO_2 + H_2 + 2NO \quad (1)$$

$$SiO_2 + 4HF \rightarrow SiF_4 + 2H_2O \quad (2)$$

The reaction of equation (1) oxidizes the silicon (Si) into silicon dioxide ($SiO_2$), whereupon the reaction of equation (2) removes such silicon dioxide and yields reaction products of silica tetrafluoride ($SiF_4$) and water ($H_2O$).

In the present example, suitable temperature differentiation between active areas 18 and passive areas 20 is achieved by selecting the pulse duration at 100 nanoseconds, for example, and the pulse interval at about an order of magnitude longer, at a minimum. With the energy pulse intensity for heat source 16 being set at $10^5$ watts/cm$^2$ and being directed towards workpiece 10, the respective maximum temperatures of the silicon active area 18 and the silicon dioxide passive areas 20 are about 80° C. and 30° C., respectively. The etch rate of silicon at the foregoing temperature is about 30 times faster than the rate for etching the silicon dioxide, whereby selective etching of the silicon occurs.

Figure 5:
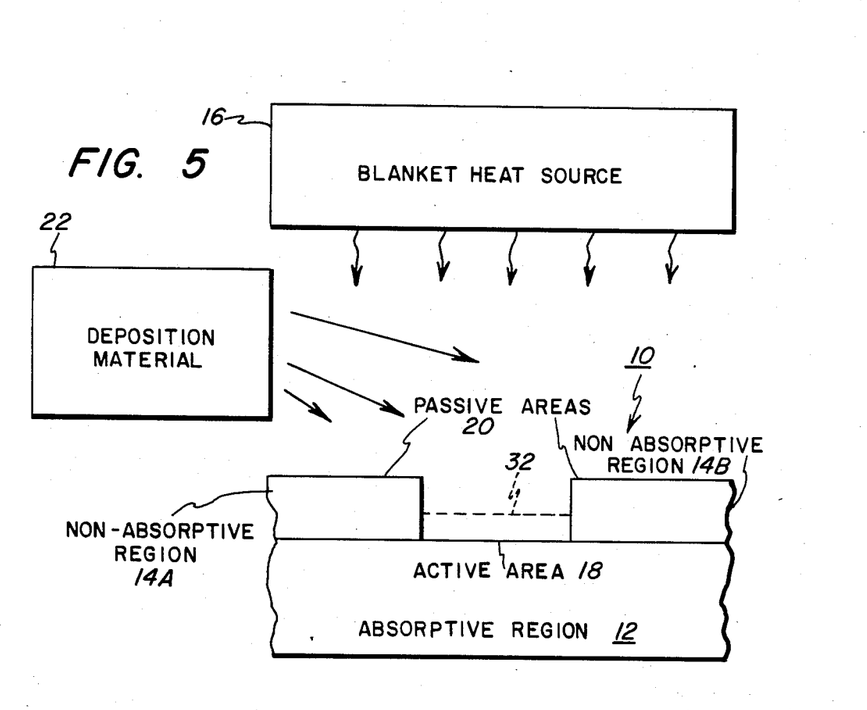
FIG. 5 depicts thermal deposition of material onto a selected area of the workpiece of FIG. 1.

FIG. 5 depicts thermal deposition on selected areas of workpiece 10, also shown in FIG. 1. That is, with reactant source 22 comprising a heat-activated deposition material, selective deposition may occur to provide layer 32 (shown in phantom) atop active area 18. The thickness of layer 32 may, if desired, be increased to equal or exceed the thickness of non-absorptive layers 14A, 14B.

EXAMPLE II

THERMAL DEPOSITION

Referring to FIG. 5, the selective deposition of tungsten (W) on silicon (Si) is now described. With absorptive region 12 comprising silicon of about 0.03 centimeter thichness, for example, and non-absorptive regions 14A and 14B comprising silicon dioxide of 0.5 micron thickness, for example, blanket heat source 16 suitably comprises a frequency-doubled Nd:YAG laser with an energy wavelength of 530 nm to achieve selective heating of active area 18. A suitable heat-activated reactant for tungsten deposition is a gas phase mixture of tungsten hexafluoride ($WF_6$) at 50 Torr pressure, hydrogen ($H_2$) at 50 Torr pressure, and an argon carrier at 700 Torr pressure.

With blanket heat source 16 set at an intensity of $10^6$ watts/cm$^2$ and directed towards workpiece 10, a suitable value of energy pulse length is 100 nanoseconds, for example, and a suitable value of pulse interval is an order to magnitude longer, at a minimum. These settings of heat source 16 are effective to produce respective maximum temperatures of the silicon active area 18 and the silicon dioxide passive area 20 of about 600° C. and 200° C., respectively. These are suitable temperatures with which to implement the following chemical reactions:

$$2WF_6 + 3Si \rightarrow 2W + 3SiF_4, \quad (3)$$

$$WF_6 + 3H_2 \rightarrow W + 6HF_6 \quad (4)$$

In these equations, tungsten hexafluoride (WF$_6$) and hydrogen (H$_2$), constitute the heat-activated reactant, and silicon (Si) comprises the active silicon surface. Once the silicon surface is covered by tungsten according to equation (3), the reaction of equation (4) enables continued growth of tungsten.

Figure 6:
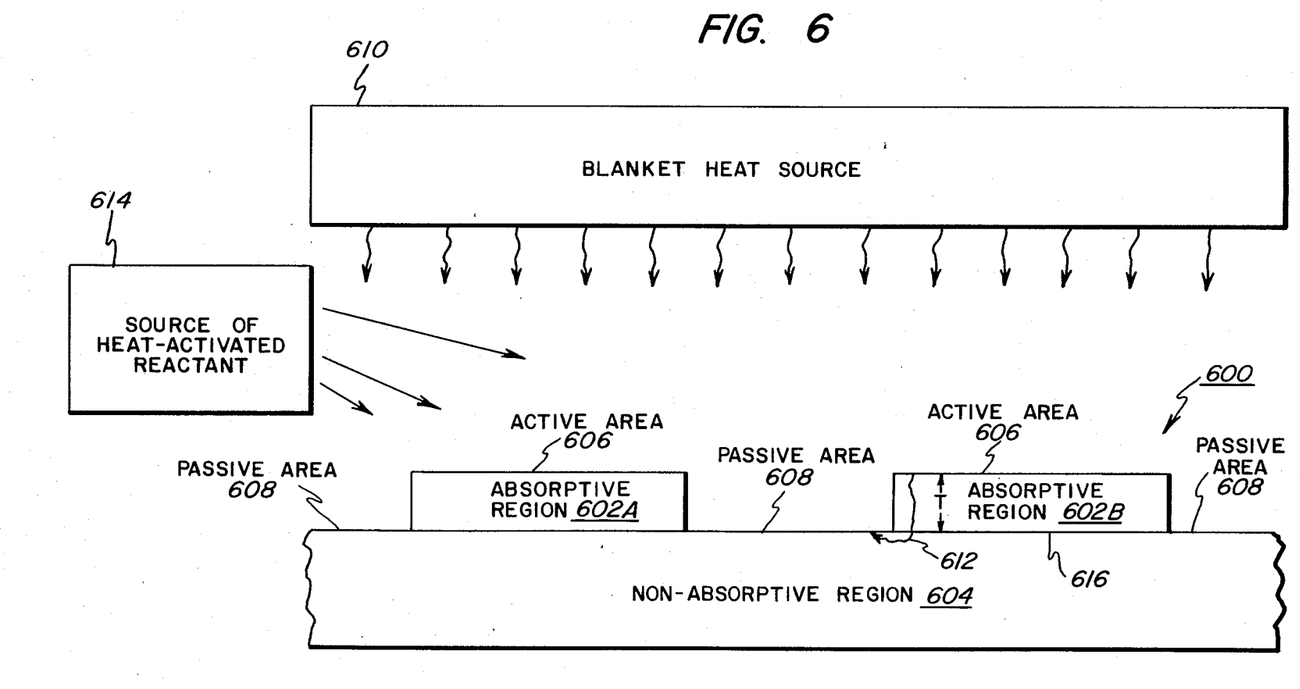
FIG. 6 is a schematic view, partially in block diagram form, of a thermal processing system in accordance with a further embodiment of the invention.

The thermal processing technique of the present invention is applicable to workpieces configured differently than workpiece 10 of FIG. 1. For example, FIG. 6 illustrates a workpiece 600 including absorptive region layers 602A and 602B atop a non-absorptive substrate region 604. Active areas 606 on which thermal processing is desired comprise the upper, exposed surfaces of the absorptive regions 602A and 602B, while passive areas 608 comprise the upper, exposed surfaces of non-absorptive region 604. As with blanket heat source 16 of FIG. 1, blanket heat source 610 of FIG. 6 has the parameter of energy wavelength selected to yield heating of absorptive regions 602A and 602B, but no direct heating of non-absorptive region 604. For example, if absorptive regions 602A, 602B comprise silicon dioxide, a suitable wavelength for a laser 610, which is inversely proportional to energy of the laser, is greater than 4.5 microns. Additionally, the energy pulse duration and pulse interval parameters of blanket heat source 610 are chosen to minimize stray heat transfer (schematically depicted as heat path 612) from active areas 606 to passive areas 608. As an additional measure to minimize stray heat transfer in path 612, the thickness, T, of absorptive regions 602A and 602B can be increased.

Source 614 of heat-activated reactant is provided to carry out desired thermal processing on active areas 606 of workpiece 600. A unique feature of the thermal processing arrangement of FIG. 6 is that workpiece 10 may be irradiated with heat energy from heat source 16 that is alternatively directed to the lower side of the workpiece. In such case, absorptive region 602B becomes directly heated at or near interface 616 (between regions 602B and 604). In this case, the thickness, T, of absorptive regions 602A, 602B is selected to be sufficiently low, and the pulse duration of blanket heat source 510 is selected to be sufficiently long, to induce a substantial temperature rise of active areas 606.

Figure 7:
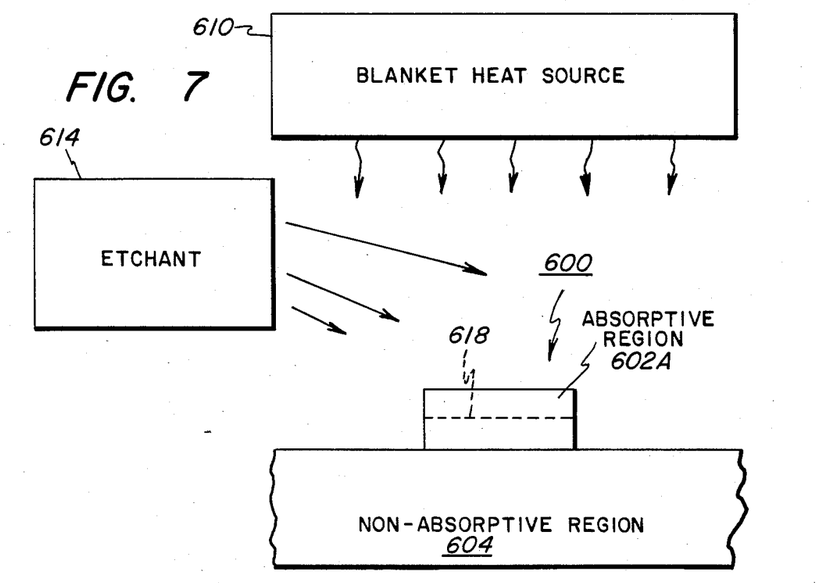

Thermal processing of workpiece 600 with a heat-activated etchant is depicted in the detail view of FIG. 7. Absorptive region 602A may be etched so as to have a reduced level 618 as shown in phantom in FIG. 7.

EXAMPLE III

THERMAL ETCHING

Referring to FIG. 7, with non-absorptive region 604 comprising silicon dioxide of thickness of about 0.5 microns, for example, and absorptive region 602A comprising polysilicon of thickness exceeding about 0.3 microns, for example, the selection of blanket heat source 610 and its operating parameters is suitably as set forth in Example I. The heat-activated etchant used and the chemical reactions governing the etching process are suitably the same as desribed in Example I.

EXAMPLE IV

THERMAL DEPOSITION

Figure 8:
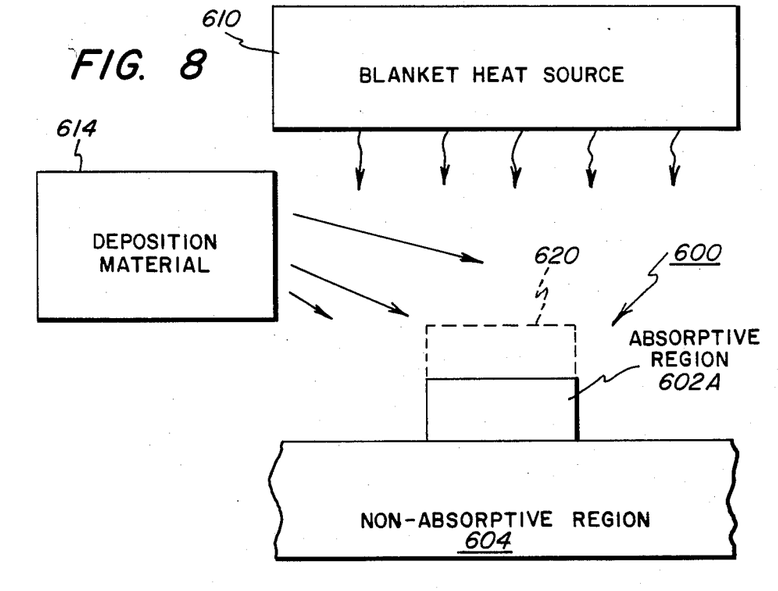
FIG. 8 depicts thermal deposition of material onto a selected area of the workpiece of FIG. 6.

With reference to FIG. 8, thermal deposition of tungsten on polysilicon is now described. With non-absorptive region 604 comprising silicon dioxide of about 0.5 micron thickness, for example, and absorptive region 602A comprising polysilicon of thickness exceeding about 0.3 micron, for example, the selection of heat source 610 and its operating parameters are suitably the same as in Example II. The heat-activated deposition reactant and the chemical equations governing the deposition process are suitably as described in Example II.

EXAMPLE V

THERMAL DEPOSITION

With reference also to FIG. 8, thermal deposition of cadmium (Cd) on silicon dioxide is now described. With non-absorptive region 604 comprising gallium arsenide of about 0.3 cm thickness, for example, and absorptive region 602A comprising silicon dioxide, of about 1 micron thickness, for example, heat source 610 suitably comprises a CO$_2$, mode-locked, Q-switched, gas laser with a wavelength of 9 microns to achieve selective heating of absorptive region 602A. A suitable heat-activated reactant comprises dimethyl cadmium (Cd(CH$_3$)$_2$) in gas phase, with the governing chemical reaction being as follows:

$$Cd(CH_3)_2 \rightarrow Cd + C_2H_6 \qquad (5)$$

That is, the reactant deposits as cadmium (Cd) on silicon dioxide and the gaseous by-product comprises ethane (C$_2$H$_6$).

To achieve selective heating of silicon dioxide at a temperature in excess of 600° C. while the gallium arsenide is maintained at a temperature well below 600° C., the energy pulse duration is suitably 100 nanoseconds and the energy interval is suitably an order of magnitude longer, at a minimum.

Figure 9:
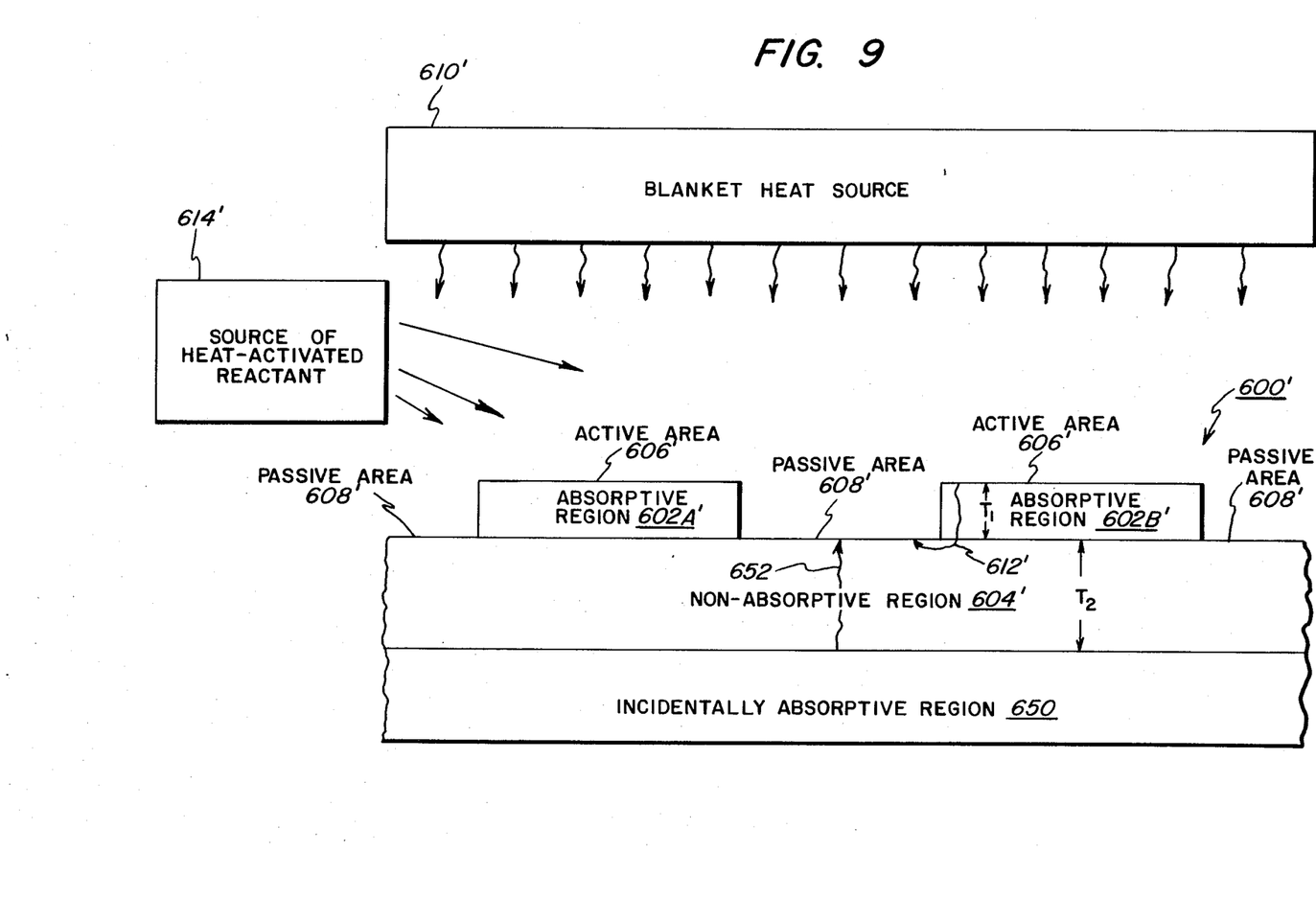
FIG. 9 is a view similar to FIG. 6, illustrating a thermal processing system in accordance with a still further embodiment of the invention.

FIG. 9 illustrates a workpiece 600', similar in various respects to workpiece 600 of FIG. 6, with like parts as between workpiece 600' and workpiece 600 being indicated by like reference numerals. Workpiece 600' differs from workpiece 600 in that the former includes an incidentally absorptive region 650 beneath a non-absorptive region 604'. This requires that blanket heat source 610' have its pulse duration reduced and its pulse interval lengthened so as to minimize heat flow 652 from incidentally absorptive region 650 to passive area 608', as well as to reduce stray heat flow 612' from active area 606' to passive area 608'. Increasing the thickness, T$_2$, of non-absorptive region 604' will additionally reduce stray heat flow 652.

Thermal processing of workpiece 600' proceeds in the same manner as illustrated in FIGS. 7 and 8 in regard to workpiece 600. By way of example, workpiece 600' may comprise polysilicon layers 602A' and 602B', overlying a layer of silicon dioxide 604' (or other dielectric material), which, in turn, overlies a silicon semiconductor substrate layer 650. Through use of the present thermal processing technique, selective etching of the polysilicon 602A', 602B' may occur, as well as selective deposition of material onto the polysilicon 602A', 602B', such as a dielectric layer or metallization.

The foregoing describes a self-registered technique for thermal processing selected areas of a workpiece. The thermal processing technique beneficially can process selected areas of a workpiece with high resolution, and may be carried out independently of the surface chemistry of the workpiece.

While the invention has been described with respect to specific embodiments, many modifications and substitutions will be apparent to those skilled in the art. It is, therefore, to be understood that the appended claims are intended to cover all such modifications and substitutions as fall within the true spirit and scope of the invention.

What is claimed as the invention and desired to be secured by Letters Patent of the United States is:

1. A method of thermal processing selected areas of an exposed surface of a workpiece, comprising the steps of:
   (a) providing a workpiece having an exposed surface comprising active areas of a first region to be heated for thermal processing thereof and passive areas of a second region to be maintained at a lower temperature than said active areas for minimizing thermal processing thereof;
   (b) providing a pulse-mode source of blanket heat energy with predetermined energy, pulse duration, and pulse interval operating parameters;
   (c) selecting the energy parameter of said heat energy source to achieve heat absorption in said first region of said workpiece, so as to raise the temperature of said active areas, while minimizing heat absorption in said second region, so as to limit any temperature rise of said passive areas;
   (d) selecting the pulse duration of said heat energy source to be sufficiently short and the pulse interval of said heat energy source to be sufficiently long so as to minimize stray heat transfer to said passive areas from either said active areas or any incidentally-heated regions of said workpiece, and thereby to minimize any temperature rise of said passive areas;
   (e) directing heat energy from said source of blanket heat energy in blanket fashion to said first and second regions of said workpiece; and
   (f) contacting said exposed surface of said workpiece with a heat-activated reactant, whereby thermal processing with said reactant occurs selectively at said active areas of said exposed surface.

2. The thermal processing method of claim 1, wherein said workpiece that is provided includes a first region of semiconductor material.

3. The thermal processing method of claim 2, wherein said semiconductor material comprises silicon.

4. The thermal processing method of claim 3 wherein said heat energy wavelength is selected to be shorter than 1.1 microns.

5. The thermal processing method of claim 2, wherein said semiconductor material comprises gallium arsenide.

6. The thermal processing method of claim 5, wherein said heat energy wavelength is selected to be shorter than 0.9 microns.

7. The thermal processing method of claim 2, wherein said workpiece that is provided further includes a second region of dielectric material.

8. The thermal processing method of claim 7, wherein said dielectric material comprises silicon dioxide.

9. The thermal processing method of claim 7 wherein said first region of semiconductor material comprises a substrate layer, and said second region of dielectric material is configured as a layer overlying said substrate layer.

10. The thermal processing method of claim 9, wherein said source of blanket energy that is provided comprises a laser.

11. The thermal processing method of claim 1, wherein said workpiece that is provided includes a first region of dielectric material.

12. The thermal processing method of claim 11, wherein said dielectric material comprises silicon dioxide.

13. The thermal processing method of claim 12, wherein said heat energy wavelength is selected to be longer than 4.5 microns.

14. The thermal processing method of claim 12, wherein said workpiece that is provided includes a second region of semiconductor material.

15. The thermal processing method of claim 14, wherein said semiconductor material comprises silicon.

16. The thermal processing method of claim 15, wherein said source of blanket heat that is provided comprises a laser.

17. The thermal processing method of claim 1, wherein the step of directing heat energy to said first and second regions of said workpiece from said source of blanket heat energy comprises the sole heating step for raising the temperature of said active area above an ambient level.

18. The thermal processing method of claim 1, wherein said heat-activated reactant that is contacted with said exposed surface of said workpiece comprises an etchant for etching said first region.

19. The thermal processing method of claim 1, wherein said heat-activated reactant that is contacted with said exposed surface of said workpiece includes deposition material.

20. The thermal processing method of claim 19, wherein said deposition material comprises metal.

21. A method of thermal processing selected areas of an exposed surface of a silicon semiconductor device, comprising the steps of:
   (a) providing a generally plate-shaped semiconductor device having an exposed surface comprising active areas of silicon semiconductor material to be heated for thermal processing thereof and passive areas of dielectric material to be maintained at a lesser temperature than said active areas for minimizing thermal processing thereof;
   (b) providing a pulse-mode laser source of blanket heat energy with predetermined energy wavelength, pulse duration, and pulse interval operating parameters;
   (c) selecting the wavelength of said heat energy means to be less than 1.1 microns to achieve heat absorption in said silicon semiconductor material, so as to raise the temperature thereof, while minimizing heat absorption in said dielectric material, so as to limit any temperature rise thereof;
   (d) selecting the pulse duration of said heat energy source to be sufficiently short and the pulse interval of said heat energy source to be sufficiently long so as to minimize stray heat transfer to said passive areas from either said active areas or any incidentally-heated regions of said semiconductor device, and thereby to limit any temperature rise of said passive areas;
   (e) directing heat energy from said source of blanket heat energy in blanket fashion to said silicon and dielectric material of said semiconductor device; and
   (f) contacting said exposed surface of said workpiece with a heat-activated reactant, whereby thermal processing with said reactant occurs selectively at said active areas of said exposed surface.

22. The thermal processing method of claim 21, wherein said heat-activated reactant that is contacted with said exposed surface of said semiconductor device comprises an etchant for etching said silicon.

23. The thermal processing method of claim 21, wherein said heat-activated reactant that is contacted with said exposed surface of said workpiece comprises deposition material.

24. The thermal processing method of claim 23, wherein said deposition material comprises metal.

* * * * *